(12) United States Patent
Leu et al.

(10) Patent No.: US 9,385,291 B2
(45) Date of Patent: *Jul. 5, 2016

(54) STRUCTURE OF THERMOELECTRIC FILM

(71) Applicant: Industrial Technology Research Institute, Hsinchu (TW)

(72) Inventors: Ming-Sheng Leu, Hsinchu County (TW); Tai-Sheng Chen, Kaohsiung (TW); Chih-Chao Shih, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/855,403

(22) Filed: Sep. 16, 2015

(65) Prior Publication Data
US 2016/0005943 A1 Jan. 7, 2016

Related U.S. Application Data

(62) Division of application No. 13/798,121, filed on Mar. 13, 2013, now Pat. No. 9,166,137.

(30) Foreign Application Priority Data

Dec. 13, 2012 (TW) .............................. 101147271 A

(51) Int. Cl.
*H01L 35/10* (2006.01)
*H01L 35/18* (2006.01)
*H01L 35/16* (2006.01)
*H01L 35/22* (2006.01)
*H01L 35/14* (2006.01)

(52) U.S. Cl.
CPC ................ *H01L 35/10* (2013.01); *H01L 35/14* (2013.01); *H01L 35/16* (2013.01); *H01L 35/18* (2013.01); *H01L 35/22* (2013.01)

(58) Field of Classification Search
CPC ......... H01L 35/10; H01L 35/14; H01L 35/22; H01L 35/18
USPC .......................... 136/205, 238, 200, 239, 240
See application file for complete search history.

(56) References Cited

U.S. PATENT DOCUMENTS

2008/0019097 A1 1/2008 Zhang et al.
2009/0169845 A1 7/2009 Leu et al.

FOREIGN PATENT DOCUMENTS

| CN | 100499195 | 6/2009 |
|---|---|---|
| JP | 2003174203 | 6/2003 |
| JP | 2010205977 | 9/2010 |
| WO | 2008021482 | 2/2008 |

OTHER PUBLICATIONS

"Office Action of China Counterpart Application", issued on Jan. 26, 2016, p. 1-p. 7.

*Primary Examiner* — Matthew Martin
*Assistant Examiner* — Tae-Sik Kang
(74) *Attorney, Agent, or Firm* — Jianq Chyun IP Office

(57) ABSTRACT

A structure of a thermoelectric film including a thermoelectric substrate and a pair of first diamond-like carbon (DLC) layers is provided. The first DLC layers are respectively located on two opposite surfaces of the thermoelectric substrate and have electrical conductivity.

12 Claims, 2 Drawing Sheets

STRUCTURE OF THERMOELECTRIC FILM

CROSS-REFERENCE TO RELATED APPLICATION

This application is a divisional application of U.S. application Ser. No. 13/798,121, filed on Mar. 13, 2013, now allowed, which claims the priority benefit of Taiwan application serial no. 101147271, filed on Dec. 13, 2012. The entirety of each of the above-mentioned patent applications is hereby incorporated by reference herein and made a part of this specification.

BACKGROUND OF THE INVENTION

1. Technical Field

The technical field relates to a structure of a thin film and more particularly to a structure of a thermoelectric film.

2. Background

In a conventional thermoelectric application field, whether a substance is a favorable thermoelectric material is determined mainly by observing a figure of merit (a ZT value) of the substance. The ZT value is relevant to a Seebeck coefficient, electrical conductivity, and a coefficient of thermal conductivity, and these three parameters pose a direct impact on whether a material is characterized by favorable thermoelectric properties and whether the material is applicable in the thermoelectric application field. The greater the ZT value, the more significant the thermoelectric effects, and the relation therebetween may be represented as follows:

$$ZT = \frac{\alpha^2 \sigma}{k} T.$$

Here, $\alpha$ refers to the Seebeck coefficient, $\sigma$ refers to the electrical conductivity, k refers to the coefficient of thermal conductivity, and T refers to an absolution temperature. It may be observed from the above equation that a favorable thermoelectric material is required to have not only the satisfactory Seebeck coefficient but also the high electrical conductivity and the low coefficient of thermal conductivity.

Among the physical properties of natural materials, electrical conductivity and thermal conductivity often have an interdependent relationship, and therefore it is rather difficult for a material to have both the high electrical conductivity and the low coefficient of thermal conductivity. Therefore, the resultant ZT value cannot be effectively increased. Even though the control of the electrical conductivity and the thermal conductivity of a material is the key to improve the thermoelectric performance of the material, said difficulty can barely be overcome by applying the existing material-related technologies. Moreover, the overall performance of thermoelectric elements is not only affected by the ZT value but also subject to thermal and electrical impedance generated during interface connection, thermal and electrical impedance of electrode materials, and thermal and electrical impedance of substrates.

SUMMARY OF THE INVENTION

One of exemplary embodiments is directed to a structure of a thermoelectric film, and resistance distribution thereof is controlled by changing bonding structure of diamond-like carbon (DLC) layers of the structure of the thermoelectric film.

In an exemplary embodiment of the disclosure, a structure of a thermoelectric film including a thermoelectric substrate, a pair of first DLC layers, a pair of metal interface layers, and a pair of metal layers is provided. The first DLC layers respectively sandwich two opposite surfaces of the thermoelectric substrate and have a resistivity from about $10^{-4}\Omega$-cm to about $10^{-1}\Omega$-cm. The metal interface layers are respectively stacked on the first DLC layers, on sides of the first DLC layers away from the thermoelectric substrate and have a resistivity ranging from about $10^{-3}\Omega$-cm to about $10^{-4}\Omega$-cm. The pair of metal layers are respectively stacked on the metal interface layers and on sides of the metal interface layers away from the first diamond-like carbon layers and have a resistivity ranging from about $10^{-5}\Omega$-cm to about $10^{-6}\Omega$-cm. The thermoelectric substrate, the first DLC layers, the metal interface layers, and the metal layers are electrically conductive; and stacked in a direction substantially perpendicular to the two opposite surfaces of the thermoelectric substrate.

In view of the above, the structure of the thermoelectric film described herein includes DLC layers, and the resistance of the DLC layers may be adjusted by controlling the structural properties of the DLC layers. Due to the DLC layers, the structure of the thermoelectric film is able to have favorable thermal conductivity. Simultaneously, the DLC layers may be characterized by properties of electrical conductivity or insulation according to actual requirements, and these DLC layers may further serve as a composite structure of the thermoelectric film, which effectively simplifies the structure of the thermoelectric element and ensures achievement of required thermoelectric effects.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
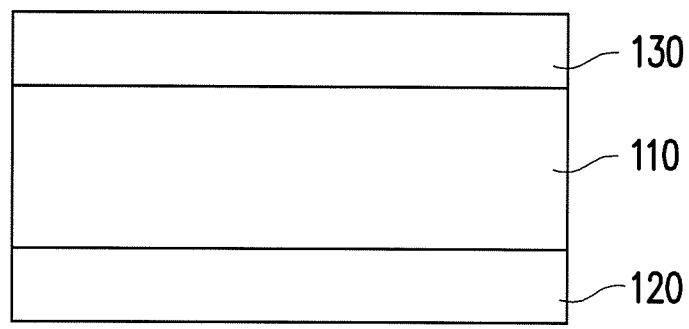
FIG. 1 is a schematic diagram illustrating a structure of a then thermoelectric film according to an exemplary embodiment of the disclosure.

FIG. 1 is a schematic diagram illustrating a structure of a thermoelectric film according to an exemplary embodiment of the disclosure. With reference to FIG. 1, in the present exemplary embodiment, a structure 100 of a thermoelectric film includes a thermoelectric substrate 110 and a pair of first diamond-like carbon (DLC) layers 120 and 130, and the first DLC layers 120 and 130 are located on two opposite surfaces of the thermoelectric substrate 110.

The thermoelectric substrate 110 includes a material capable of converting heat into electricity, and the material may refer to a p-type thermoelectric material or an n-type thermoelectric material. For instance, the material may be BiSbTe, BiSeTe, CsBi4Te6, $Bi_2Te_3$, $Bi_2Te_3/Se_2Te_3$ super lattices, PbTeSeTe/PbTe quantum dots or super lattices, $Zn_4Sb_3$ alloy, $Ce(Fe,Co)_4Sb_{12}$, PbTe alloy, $CoSb_3$, SiGe alloy, AgSbTe$_2$/GeTe, $Bi_2Sr_2Co_2O_y$, $Ca_3Co_4O_9$, $Mg_2Si$, $Na_xCoO_2$, $La_2Te_3$, $MnSi_{1.75}$, SnTe, TAGS (tellurium, antimony, germanium and silver), or $Y_3Fe_5O_{12}$, and so on. Since the structure of the thermoelectric substrate 110 is not the focus of the disclosure and may be referred to as the structure corresponding to the existing thermoelectric element, no additional description with respect to the structure of the thermoelectric substrate 110 is provided hereinafter.

Each of the first DLC layers 120 and 130 is pure carbon or tetrahedral amorphous carbon doped with hydrogen, nitrogen, or metal atoms, and the way to stack the first DLC layers 120 and 130 onto the thermoelectric substrate 110 includes electroplating, electroless plating, sputtering, ion evaporation, or chemical vapor deposition (CVD). The disclosure is not limited thereto. Note that a thickness of the thermoelectric substrate 110 ranges from about 2 μm to about 200 μm, a thickness of each of the first DLC layers 120 and 130 stacked onto the thermoelectric substrate 110 ranges from about 100 nm to about 100 μm, and a resistivity of each of the first DLC layers 120 and 130 ranges from about $10^{-4}$ Ω-cm to about $10^{-4}$ Ω-cm.

As described above, the first DLC layers 120 and 130 stacked onto the thermoelectric substrate 110 have low resistance (i.e., high electrical conductivity); thus, the first DLC layers 120 and 130 may act as conductive electrodes of the structure 100 of the thermoelectric film to replace the conventional metal electrodes. The advantages of employing the first DLC layers 120 and 130 as the conductive electrodes of the structure 100 of the thermoelectric film rest in that the thermal and electrical impedance between the metal electrodes and the thermoelectric substrate 110 is not as small as the thermal and electrical impedance between the DLC material and the thermoelectric substrate 110. Thereby, using the structure 100 of the thermoelectric film equipped with the first DLC layers 120 and 130 not only resolves the conventional issue of thermal and electrical impedance generated during interface connection but also guarantees the high electrical conductivity and the low coefficient of thermal conductivity.

Figure 2:
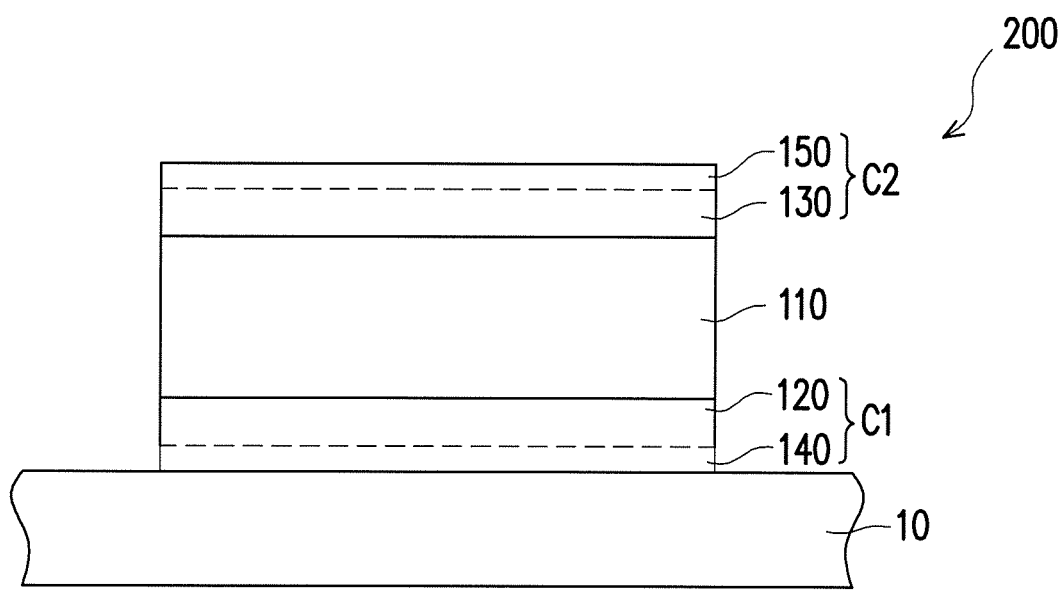
FIG. 2 is a schematic diagram of applying the structure of the thermoelectric film depicted in FIG. 1.

FIG. 2 is a schematic diagram of applying the structure of the thermoelectric film depicted in FIG. 1. With reference to FIG. 2, the difference between the previous exemplary embodiment and the present exemplary embodiment lie in that the structure 200 of the thermoelectric film further includes a second DLC layer 140 that is located on an object 10 and between the first DLC layer 120 and the object 10, such that the structure 200 of the thermoelectric film may be placed on the object 10 for conducting heat of the object 10 outward.

In particular, the first DLC layers 120 and 130 and the second DLC layer 140 are made of the same material, while the compositions thereof are different. That is, bonding ratios of SP2 to SP3 of the first DLC layers 120 and 130 and the second DLC layer 140 are different (if the ratio accounted for by SP2 is high, the resistivity is low; if the ratio accounted for by SP3 is high, the resistivity is high). Besides, since the thickness of the second DLC layer 140 ranges from about 100 nm to about 10 μm, the resultant resistivity of the second DLC layer 140 ranges from about $10^0$ Ω-cm to about $10^{10}$ Ω-cm. That is, the second DLC layer 140 described herein is an insulation layer for preventing electrical conduction between the object 10 and the structure 200 of the thermoelectric film.

Similarly, a second DLC layer 150 with great resistance may be placed on a side of the first DLC layer 130 away from the thermoelectric substrate 110.

In comparison with the related art (i.e., an insulation layer is required to be additionally placed between the thermoelectric element and the object), the present exemplary embodiment discloses that bonding structure of the DLC layers may be changed, such that the first DLC layers 120 and 130 may have high electrical conductivity similar to that of the metal electrode, and that the second DLC layers 140 and 150 may have great resistance required by the insulation layer.

From another perspective, the first DLC layer 120 and the second DLC layer 140 are integrally formed with a resistivity ranging from about $10^{-4}$ Ω-cm to about $10^{10}$ Ω-cm. Particularly, by controlling the manufacturing process, the DLC layer C1 described in the present embodiment may be directly configured on the object 10, and the DLC layer C1 includes the structural features of the first DLC layer 120 and the second DLC layer 140; likewise, the DLC layer C2 includes the structural features of the first DLC layer 130 and the second DLC layer 150. In FIG. 2, dotted lines serve to separate the first DLC layer 130 and the second DLC layer 150 and also serve to separate the first DLC layer 120 and the second DLC layer 140. Besides, a resistance of the structure of the thermoelectric film increases continuously from to the second DLC layer 140 sequentially. Thereby, the structure of the existing thermoelectric element which requires metal electrodes and an insulation layer may be further simplified. In addition, on account of said integral structure of the first and second DLC layers, the issue of thermal and electrical impedance generated during interface connection may be effectively resolved, and the performance of the structure 100 of the thermoelectric film may be enhanced.

Figure 3:
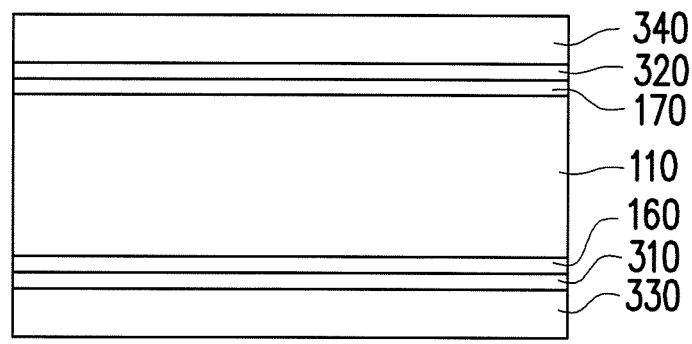
FIG. 3 is a schematic diagram illustrating a structure of a thermoelectric film according to another exemplary embodiment of the disclosure.

FIG. 3 is a schematic diagram illustrating a structure of a thermoelectric film according to another exemplary embodiment of the disclosure. With reference to FIG. 3, in the present exemplary embodiment of the disclosure, a structure 300 of a thermoelectric film includes a thermoelectric substrate 110, first DLC layers 160 and 170, metal interface layers 310 and 320, and metal layers 330 and 340. The first DLC layers 160 and 170 are located on two opposite surfaces of the thermoelectric substrate 110. The metal interface layers 310 and 320 are respectively located on the first DLC layers 160 and 170, and each of the metal interface layers 310 and 320 is located on a side of one of the first DLC layers 160 and 170 away from the thermoelectric substrate 110. The metal layers 330 and 340 are respectively located on the metal interface layers 310 and 320, and each of the metal layers 330 and 340 is located on a side of one of the metal interface layers 310 and 320 away from one of the first DLC layers 160 and 170. The thermoelectric substrate 110 and the first DLC layers 160 and 170 described herein are identical to those described in the above-mentioned embodiment; therefore, a detailed description thereof is omitted. The metal interface layers 310 and 320 are made of metal carbide, for instance; a thickness of each of the metal interface layers 310 and 320 is less than 1 μm; a resistivity of each of the metal interface layers 310 and 320 ranges from about $10^{-3}$ Ω-cm to about $10^{-4}$ Ω-cm. A thickness of each of the metal layers 330 and 340 is substantially less than 100 μm, and a resistivity of each of the metal layers 330 and 340 ranges from about $10^{-5}$ Ω-cm to about $10^{-6}$ Ω-cm. That is, the thermoelectric substrate 110, the first DLC layers 160 and 170, the metal interface layers 310 and 320, and the metal layers 330 and 340 are electrically conducted.

Due to the first DLC layers 160 and 170 and the metal interface layers 310 and 320, the bonding strength between the metal layers 330 and 340 and the thermoelectric substrate 110 may increase. What is more, the high thermal conductivity and the high electrical conductivity of the first DLC layers 160 and 170 are conducive to improvement of thermoelectric performance of the structure 300 of the thermoelectric film described herein.

Figure 4:
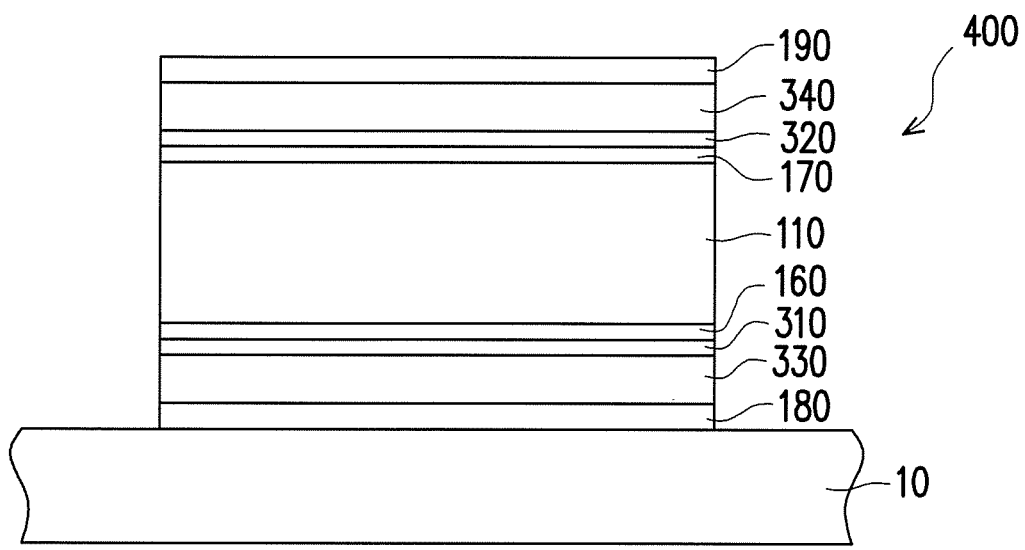
FIG. 4 is a schematic diagram of applying the structure of the thermoelectric film depicted in FIG. 3.

FIG. 4 is a schematic diagram of applying the structure of the thermoelectric film depicted in FIG. 3. Similar to the exemplary embodiment shown in FIG. 2, the present exemplary embodiment discloses the structure 400 of the thermoelectric film which may be placed on the object 10, so as to conduct heat of the object 10 outward. The structure 400 of the thermoelectric film further includes second DLC layers 180 and 190. The second DLC layer 180 is located on the object 10 and between the metal layer 330 and the object 10; the second DLC layer 190 is located on one side of the metal layer 340 away from the metal interface layer 320. Through the configuration of the second DLC layers 180 and 190, the structure 400 of the thermoelectric film is capable of achieving the effects equivalent to those achieved by an insulation layer as described in the exemplary embodiment shown in FIG. 2.

To sum up, the structure of the thermoelectric film described herein includes DLC layers, and the resistance of the DLC layers may be adjusted by controlling the structural properties of the DLC layers. The DLC layers allow the structure of the thermoelectric film to have favorable thermal conductivity. Simultaneously, the DLC layers may be characterized by properties of electrical conductivity or insulation according to actual requirements.

Moreover, the DLC layers that are integrally formed and allowed to have continuous resistance, i.e., the electrical conductivity of the DLC layers is continuous as well. Therefore, thermal and electrical impedance generated during interface connection may be precluded, and the structure of the thermoelectric film may be well located on the object. As a result, the required thermoelectric effects may be achieved by the effective and simplified structure of the thermoelectric film.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A structure of a thermoelectric film comprising:
a thermoelectric substrate;
a pair of first diamond-like carbon layers respectively sandwiching two opposite surfaces of the thermoelectric substrate and having a resistivity ranging from about $10^{-4}\Omega$-cm to about $10^{-1}\Omega$-cm;
a pair of metal interface layers, respectively stacked on the first diamond-like carbon layers and on sides of the first diamond-like carbon layers away from the thermoelectric substrate and having a resistivity ranging from about $10^{-3}\Omega$-cm to about $10^{-4}\Omega$-cm;
a pair of metal layers, respectively stacked on the metal interface layers and on sides of the metal interface layers away from the first diamond-like carbon layers and having a resistivity ranging from about $10^{-5}\Omega$-cm to about $10^{-6}\Omega$-cm; and
wherein the thermoelectric substrate, the first diamond-like carbon layers, the metal interface layers, and the metal layers are electrically conductive; and stacked in a direction perpendicular to the two opposite surfaces of the thermoelectric substrate.

2. The structure of the thermoelectric film as recited in claim 1, wherein a thickness of the thermoelectric substrate ranges from about 2 μm to about 200 μm.

3. The structure of the thermoelectric film as recited in claim 1, wherein the thermoelectric substrate comprises BiSbTe, BiSeTe, CsBi4Te6, $Bi_2Te_3$, $Bi_2Te_3/Se_2Te_3$ super lattices, PbTeSeTe/PbTe quantum dots or super lattices, $Zn_4Sb_3$ alloy, $Ce(Fe,Co)_4Sb_{12}$, PbTe alloy, $CoSb_3$, SiGe alloy, $AgSbTe_2/GeTe$, $Bi_2Sr_2Co_2O_y$, $Ca_3Co_4O_9$, $Mg_2Si$, $Na_xCoO_2$, $La_2Te_3$, $MnSi_{1.75}$, SnTe, TAGS, or $Y_3Fe_5O_{12}$.

4. The structure of the thermoelectric film as recited in claim 1, wherein each of the first diamond-like carbon layers is pure carbon, or tetrahedral amorphous carbon doped with hydrogen, nitrogen or metal atoms.

5. The structure of the thermoelectric film as recited in claim 1, wherein a thickness of each of the first diamond-like carbon layers ranges from about 100 nm to about 100 μm.

6. The structure of the thermoelectric film as recited in claim 1, wherein a thickness of each of the metal interface layers is substantially less than 1 μm.

7. The structure of the thermoelectric film as recited in claim 1, wherein the metal interface layers are metal carbide.

8. The structure of the thermoelectric film as recited in claim 1, wherein a thickness of each of the metal layers is substantially less than 100 μm.

9. The structure of the thermoelectric film as recited in claim 1, further comprising:
at least one second diamond-like carbon layer stacked on the metal layers and on sides of the metal layers away from the first diamond-like carbon layers and having a resistivity ranging from about $10^{0}\Omega$-cm to about $10^{10}\Omega$-cm.

10. The structure of the thermoelectric film as recited in claim 9, wherein a thickness of the at least one second diamond-like carbon layer ranges from about 100 nm to about 10 μm.

11. The structure of the thermoelectric film as recited in claim 9, wherein each of the second diamond-like carbon layers is pure carbon, or tetrahedral amorphous carbon doped with hydrogen, nitrogen or metal atoms.

12. The structure of the thermoelectric film as recited in claim 9, wherein the at least one second diamond-like carbon layer comprises a pair of second diamond-like carbon layers respectively stacked on the pair of metal layers, each of the second diamond-like carbon layers is stacked on the metal layers and on sides of the metal layers away from the first diamond-like carbon layers.

\* \* \* \* \*